United States Patent
Hale et al.

[11] Patent Number: 6,147,818
[45] Date of Patent: Nov. 14, 2000

[54] PROJECTION OPTICS BOX

[75] Inventors: Layton C. Hale, Livermore; Terry Malsbury, Tracy; Russell M. Hudyma, San Ramon; John M. Parker, Tracy, all of Calif.

[73] Assignee: The Regents of the University of California, Oakland, Calif.

[21] Appl. No.: 09/217,739

[22] Filed: Dec. 21, 1998

[51] Int. Cl.[7] ................................................ G02B 7/02
[52] U.S. Cl. ......................... 359/819; 359/822; 359/813
[58] Field of Search ................................. 359/813, 814, 359/819, 822, 823, 824

[56] References Cited

U.S. PATENT DOCUMENTS

| | | | |
|---|---|---|---|
| 5,410,434 | 4/1995 | Shafer | 359/858 |
| 5,420,436 | 5/1995 | Seya et al. | 250/492.1 |
| 5,526,192 | 6/1996 | Imura et al. | 359/813 |
| 5,581,317 | 12/1996 | Kitagawa et al. | 396/421 |
| 5,592,239 | 1/1997 | Hara et al. | 348/771 |
| 5,959,784 | 9/1999 | Seki et al. | 359/663 |

FOREIGN PATENT DOCUMENTS

09293676 2/1998 Japan.

*Primary Examiner*—Ricky Mack
*Attorney, Agent, or Firm*—L. E. Carnahan; Alan H. Thompson

[57] ABSTRACT

A projection optics box or assembly for use in an optical assembly, such as in an extreme ultraviolet lithography (EUVL) system using 10–14 nm soft x-ray photons. The projection optics box utilizes a plurality of highly reflective optics or mirrors, each mounted on a precision actuator, and which reflects an optical image, such as from a mask, in the EUVL system onto a point of use, such as a target or silicon wafer, the mask, for example, receiving an optical signal from a source assembly, such as a developed from laser system, via a series of highly reflective mirrors of the EUVL system. The plurality of highly reflective optics or mirrors are mounted in a housing assembly comprised of a series of bulkheads having wall members secured together to form a unit construction of maximum rigidity. Due to the precision actuators, the mirrors must be positioned precisely and remotely in tip, tilt, and piston (three degrees of freedom), while also providing exact constraint.

19 Claims, 15 Drawing Sheets

PROJECTION OPTICS BOX

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to projection optics, particularly to a projection optics assembly, and more particular to a projection optics box or assembly having a plurality of highly reflective optics located therein, with each optic being mounted to a precision actuator, for reflecting an image onto a point of use.

Optical lithography has provided the enabling technology to support the integrated circuit (IC) industry for several decades. However, new approaches will be required to maintain the projections for IC manufacturing after the turn of the century. One promising technology which builds on the optical experience is extreme ultraviolet lithography (EUVL) using 10 to 14 nm soft x-ray photons. For these wavelengths and 4x reduction, low numerical aperture (NA) imaging systems with printing resolutions less than 100 nm and a depth of focus (DOF) greater than 1$\mu$are obtained. Technology scaling is expected to support several IC generations down to possibly 0.031 $\mu$m. Because EUV photons are highly absorbed in essentially all materials and gases, special reflective optics contained in a vacuum environment are required to produce imaging.

EUV lithography has several advantages over other technologies. EUVL parallels and builds on the conventional optical lithography experience base: 1) imaging follows the relationships of conventional optics for resolution and DOF as a function of NA and is expected to scale down to 30 nm; 2) the robust 4x masks are easier to write than 1x, do not use fragile membrane, segmented masks and use conventional silicon processing to define the final geometric patterns on the mask; 3) the use of low NA optics provides good depth of focus for isolated and dense structures simultaneously, minimizing the need for mask biasing, 4) the technology provides a granular lithography tools solution for facility implementation when the laser produced plasma or other discrete source is used; 5) photoresists used currently are potentially extendible to EUV wavelengths; and 6) the technology is fully compatible with circuit design rules and could be introduced selectively at 0.13 $\mu$m. In addition, the x-ray synchrotron sources may be used for EUVL with an appropriate condenser design.

Although technical progress in EUVL is being made, a number of challenges remain which must be addressed to assure the successful development of production equipment. These include: 1) continued improvement in EUV source efficiency and output power, 2) development of technical improvements and commercial sources for aspherical optics with adequate shape and finish, 3) optical coatings with maximum reflectivity at the selected wavelength which are stable with time, (4) projection optics for efficient imaging between the mask and the target or wafer, and 5) final integration of the entire system, complete with commercial mask and resist suppliers.

Substantial effort has been directed to development of aspherical optic utilizing highly reflective multilayer systems which reduce the stress on the substrate so as to obtain the desired shape and finish. These efforts are exemplified by U.S applications Ser. No. 09/027,308 filed Feb. 20, 1998, entitled "High Reflectance-Low Stress Mo-Si Multilayer Reflective Coatings", and Ser. No. 09/027,309 filed Feb. 20, 1998, entitled "Method-To Adjust Multilayer Film Stress Induced Deformation Of Optics", now U.S. Pat. No. 6,011,646 issued Jan. 4, 2000. Additional efforts to resolve the optics stress problem are exemplified by U.S. application Ser. No. 09/160,264, filed Sep. 25, 1998, entitled "Improved Method To Adjust Multilayer Film Stress Induced Deformation Of Optics"; U.S. application Ser. No. 09/157,116, filed Sep. 18, 1998, entitled "Post Deposition Method To Adjust The Reflectance Peak Position Of Extreme Ultraviolet Multilayer Mirrors"; and U.S. application Ser. No. 09/173,769, filed Oct. 16, 1998, entitled "Embedded Fiducials In Optics Surfaces" now U.S. Pat. No. 6,014,264 issued Jan. 1, 2000. Also, various efforts have been directed to the mounting of the optical components or mirrors, which are exemplified by U.S. application Ser. No. 09/098,693 filed Jun. 7, 1998, entitled "Precision Tip-Tilt-Piston Actuator That Provides Exact Constraint" now U.S. Pat. No. 5,986,827 issued Nov. 16, 1999; and U.S. application Ser. No. 09/164,414, filed Sep. 30, 1998, entitled "Pedestal Substrate For Coated Optics".

The present invention is directed to a solution of the above-identified challenge of providing efficient and effective projection optics between the mask and the target, such as a silicon wafer, of an EUVL system. The present invention involves a projection optics (PO) box or assembly positioned intermediate the mask and the target, and containing a plurality of optical components or mirrors, each being mounted on a precision actuator. In the illustrated embodiment four (4) optical components are utilized. the PO box is composed of a plurality of bulkheads secured together to form a unit construction of maximum rigidity. Three bulkheads are utilized in the illustrated embodiment.

SUMMARY OF THE INVENTION

It is an object of the present invention to provide projection optics to effectively reflect an optical signal to a point of use.

A further object of the invention is to provide a projection optics box containing a plurality of optical components, each mounted to a precision actuator.

Another object of the invention is to provide a projection optics box composed of a plurality of bulkheads secure to provide a rigid unit within which a plurality of projection optics components are mounted.

Another object of the invention is to provide a projection optics box for use in an EUVL system.

Another object of the invention is to provide a projection optics box containing a plurality of individually mounted optics and located intermediate the mask and the target of an EUVL system.

Other objects and advantages of the present invention will become apparent from the following description and accompanying drawings. The present invention is directed to a projection optics (PO) box or assembly having a plurality of optical components mounted therein. Each of the optical components may be mounted on a precision actuator to provide movement in the x, y, and z (tip, tilt, and piston) directions. The PO box is composed of a plurality of bulkheads or sections having openings therein and secured together to form a rigid unit of construction. The PO box may be utilized in various applications requiring precision imaging, but is particularly applicable for use between the mask and the target of an EUVL system utilizing 10 to 14 nm soft x-ray photons, the optical components of the PO box having a reflectivity of greater than 65% and can be constructed and positioned to reflect at essentially the exact same wavelength.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to a projection optics (PO) box or assembly for use in an imaging system, such as an EUVL system using 10 to 14 nm wavelength soft x-ray photon, wherein high-reflectivity (65% or greater) of each optical component is essential. The PO box is composed of a plurality of bulkheads having opening therein to provide access to the optics within the PO box, and each optic may be mounted on a precision actuator to enable movement in the x, y, and z planes which provides exact constraint. The embodiment of the invention illustrated and described hereinafter is constructed for use intermediate the mask and target of an EUVL system, but the invention may be utilized in other imaging systems. In this embodiment a four (4) optic or mirror arrangement is utilized with each optic or mirror mounted to a precision actuator. However, any number of optics may be utilized, and any or all of the optics may be mounted via a precision actuator.

Figure 1:
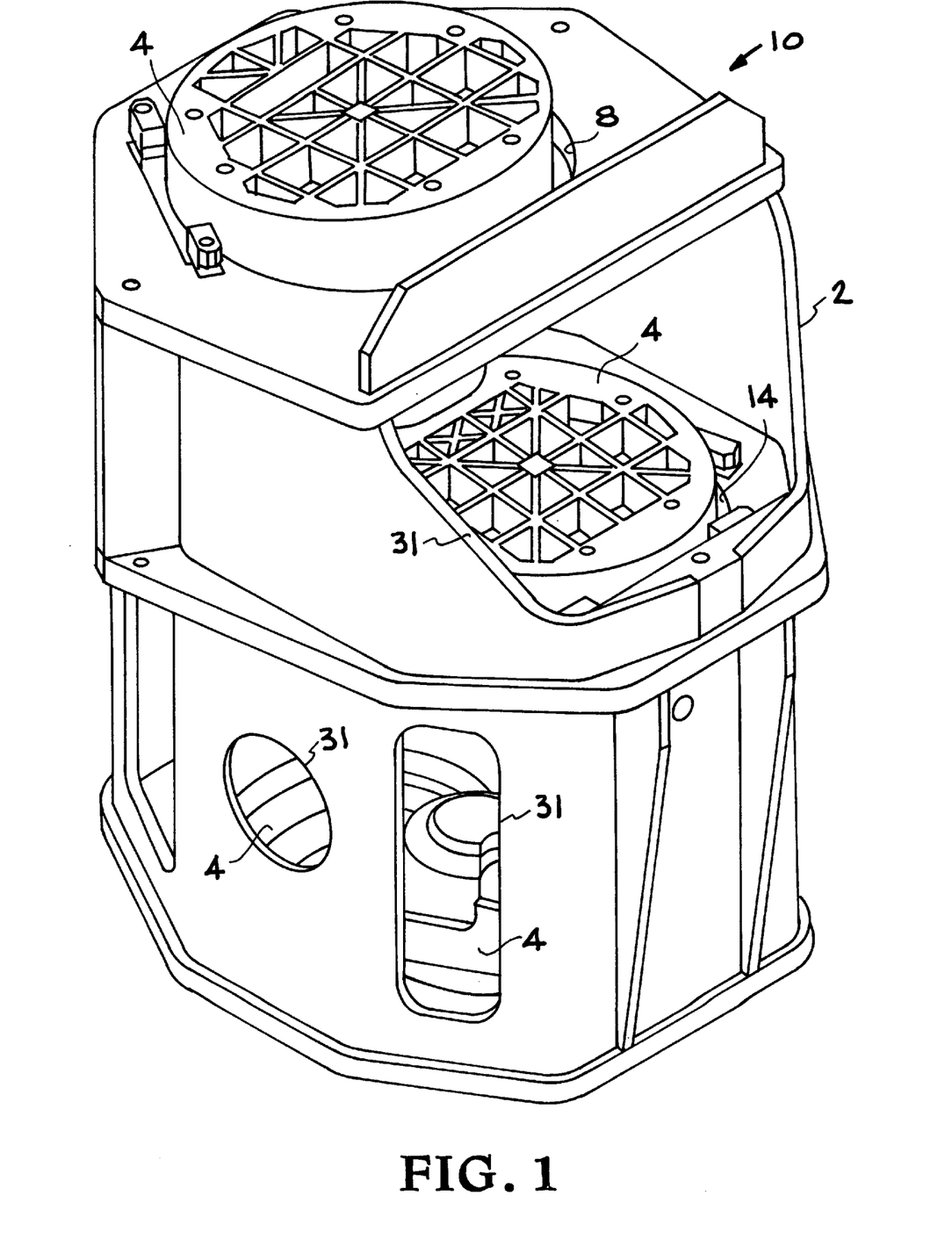
FIG. 1 illustrates an embodiment of a projection optics (PO) box or assembly containing a plurality of optics and mode in accordance with the present invention.
Figure 2:
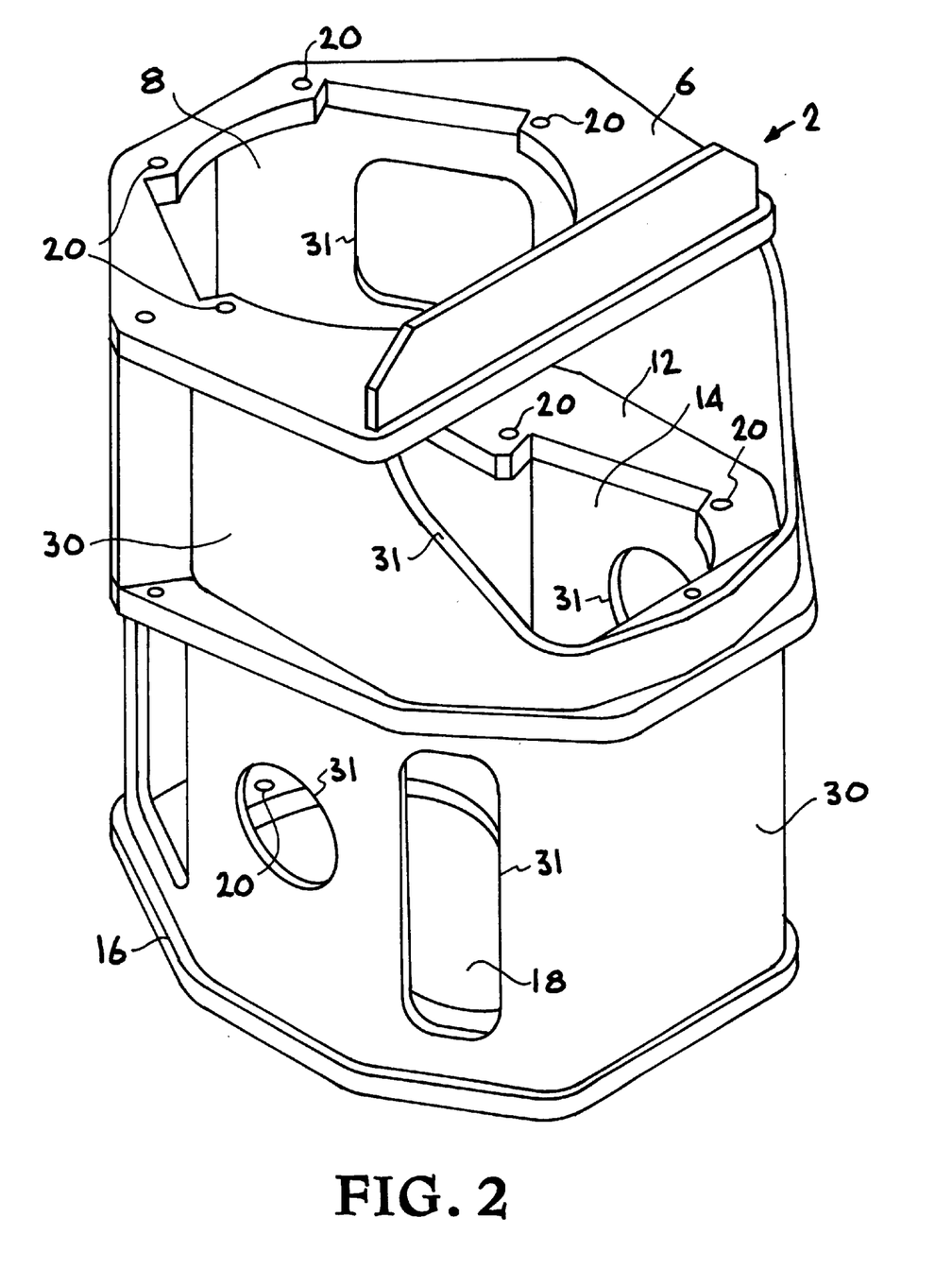
FIG. 2 is an isometric view of the FIG. 1 PO box composed of bulkheads with cutouts to provide access to the optics therein.
Figure 3:
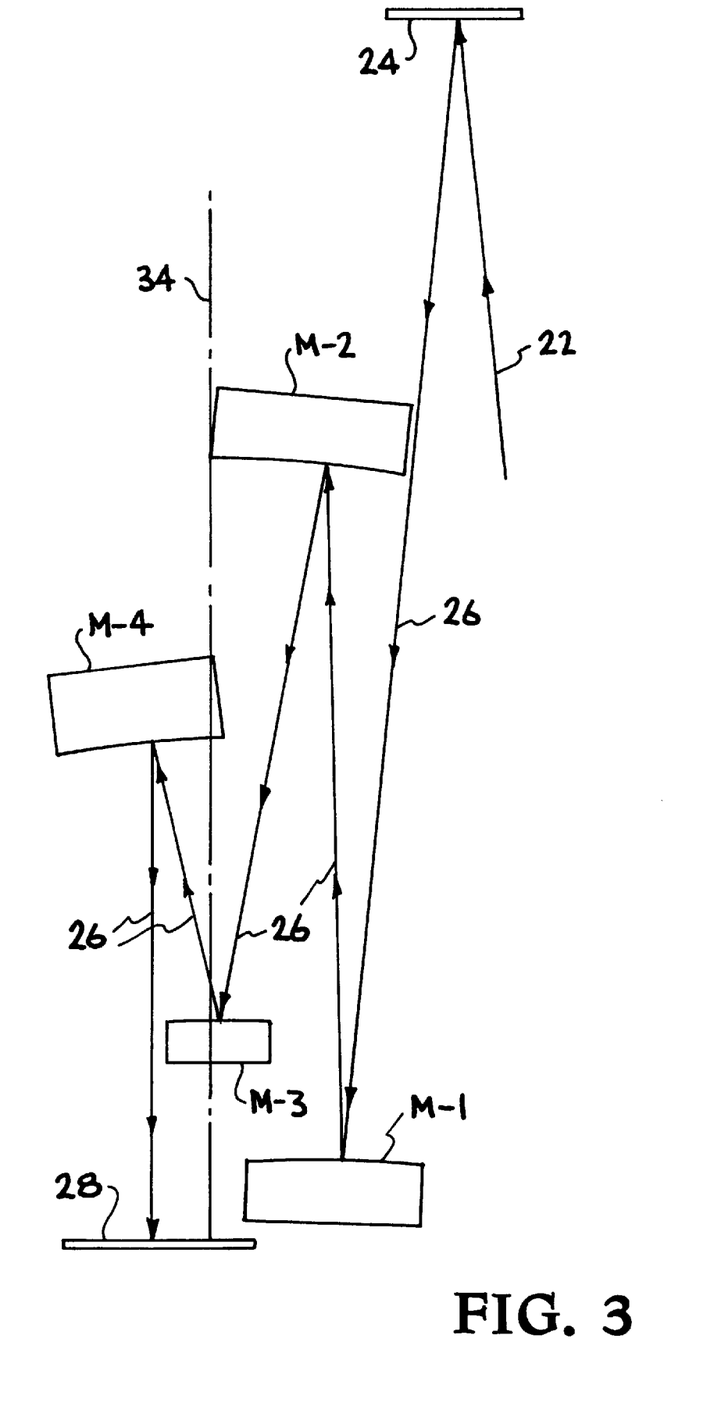
FIG. 3 illustrates the optical path of the projected beam of the FIG. 1 PO box, positioned between a mask and target (wafer) of an EUVL system.

Referring now to the drawing, FIG. 1 illustrates an embodiment of the PO box or assembly and is generally indicated at 10 having a structure defining a housing 2 having four (4) precision actuator assemblies 4 mounted in or on housing 2 for optics or mirrors M1, M2, M3 and M4, as shown in FIG. 3. FIG. 2 shows an isometric view of the PO box structure or housing 2 composed of a top bulkhead 6 having an opening 8 for a precision actuator, a middle bulkhead 12 having a cutout 14 for precision actuator, and a bottom bulkhead 16 having a cutout for a precision actuator. The bulkheads 6, 12 and 16 are interconnected by wall members 30. An attachment point for the fourth precision actuator is indicated at 20. The bulkheads 6, 12 and 16 and the wall members 30 are welded together to form a unit construction of maximum rigidity.

FIG. 3 shows the optics path of a projected or illuminating beam 22 from a source (see FIG. 14, for example) which illuminates a mask/reticle 24 which forms a pattern beam 26 and travels to mirror M1, which reflects beam 26 onto mirror M2, and is again reflected onto mirror M3, which in turn reflects the pattern beam 26 onto a target 28, such as a silicon wafer. Thus, the PO box 10 provides a multipass, or folded, reduction system having an offset optical axis indicated at 34. The composition and dimensions of each of mirrors M1, M2, M3, and M4 is dependent on the specific application, wavelength, etc. By way of example, the distance from mask 24 to wafer 28 is 1.1 m. While not shown in FIG. 3, each of mirrors M1 to M4 are mounted on a precision actuator indicated at 4 in FIG. 1, which may be of the type illustrated in FIGS. 15–16 and described hereinafter.

Figure 4A:
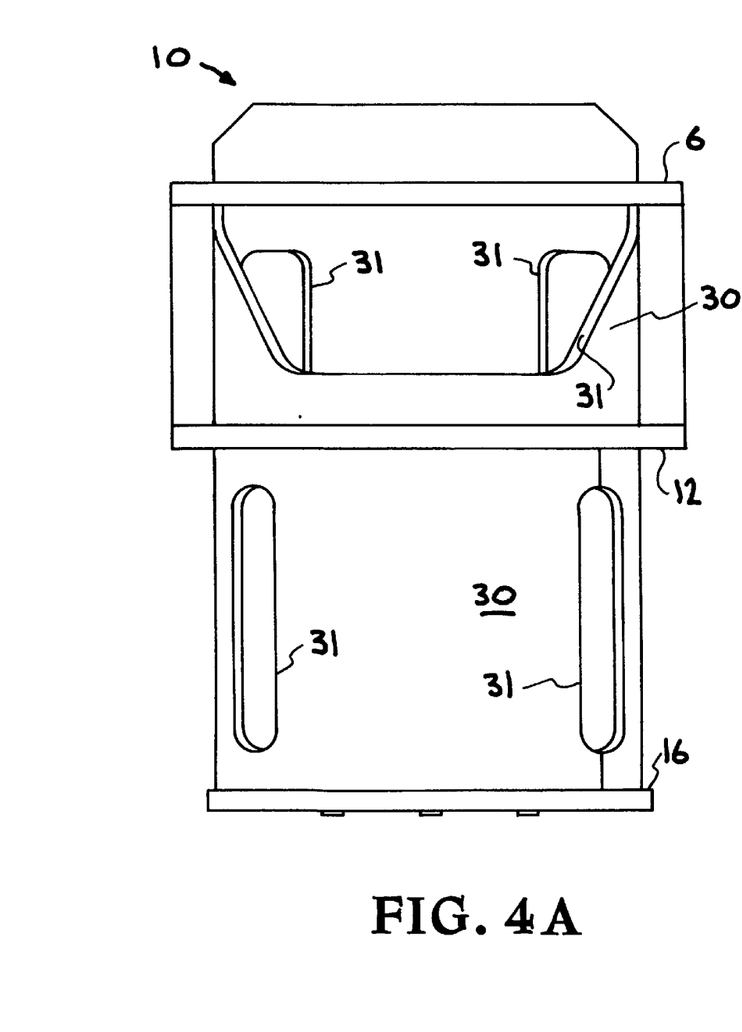
FIG. 4A shows a front view of the PO box of FIG. 1.
Figure 4B:
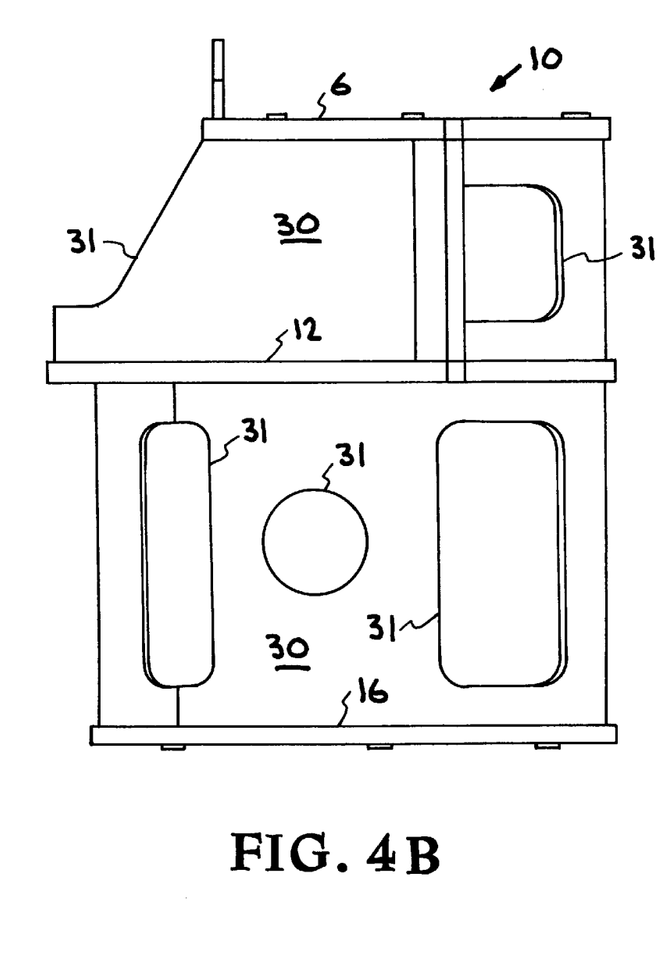
FIG. 4B shows a side view of the PO box of FIG. 1.

FIG. 4A and 4B show front and side views of the PO box 10 of FIG. 1 illustrating the top, middle, and bottom bulkheads 6, 12 and 16, and the interconnecting wall members 30. The wall members 30 are provided with a plurality of access openings generally indicated at 31.

Figure 5:
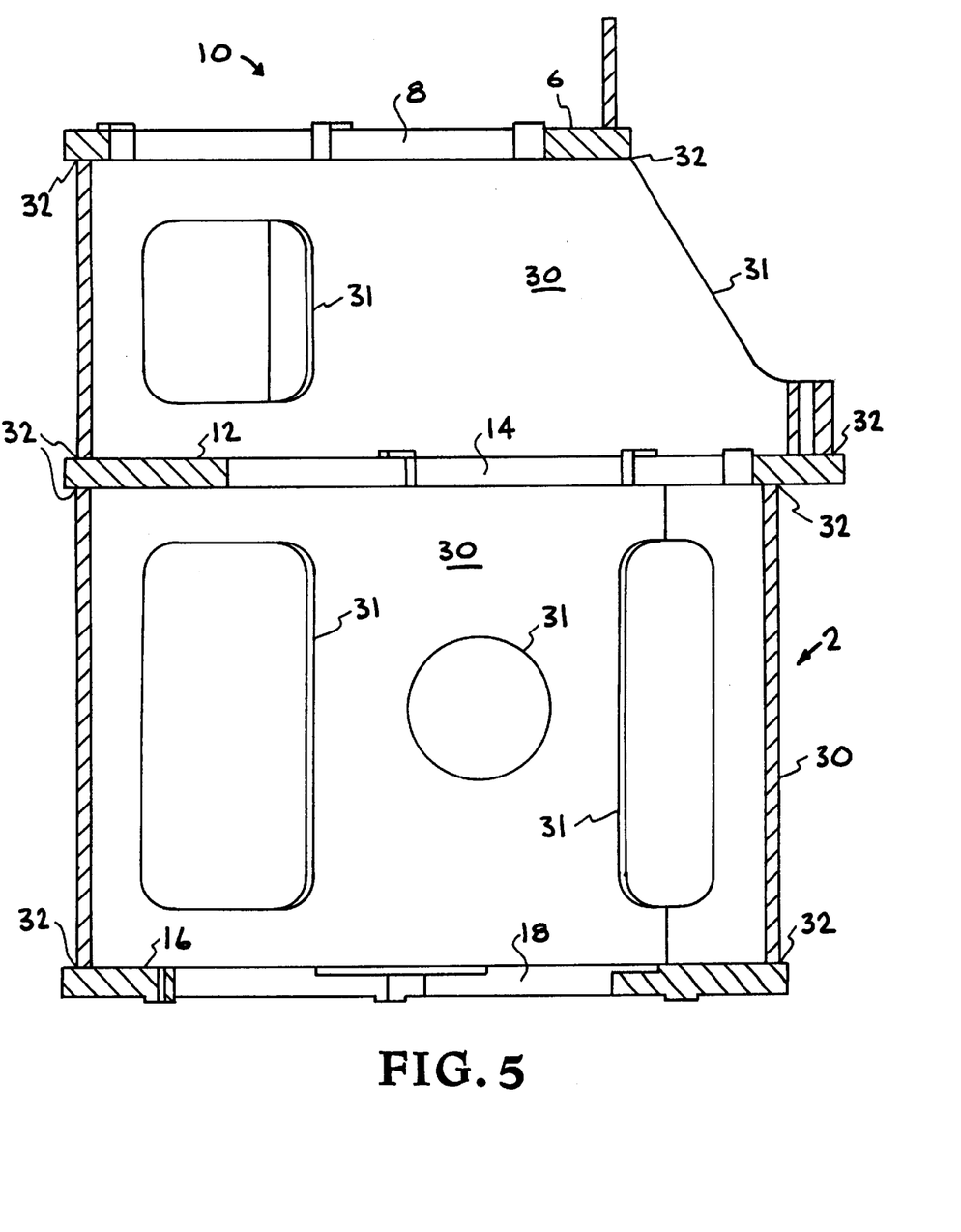
FIG. 5 illustrates a cross section of the PO box of FIG. 1.

FIG. 5 shows a cross-section of the housing or structure 2 of the PO box 10 of FIG. 1 with the cutouts 8, 14 and 18 in bulkheads 6, 12 and 16 for mounting the precision actuators 4 (see FIG. 1). The wall members 30 are welded to the bulkheads 6, 12 and 16 as indicated at 32 to provide the rigid unit structure 2.

Figure 6:
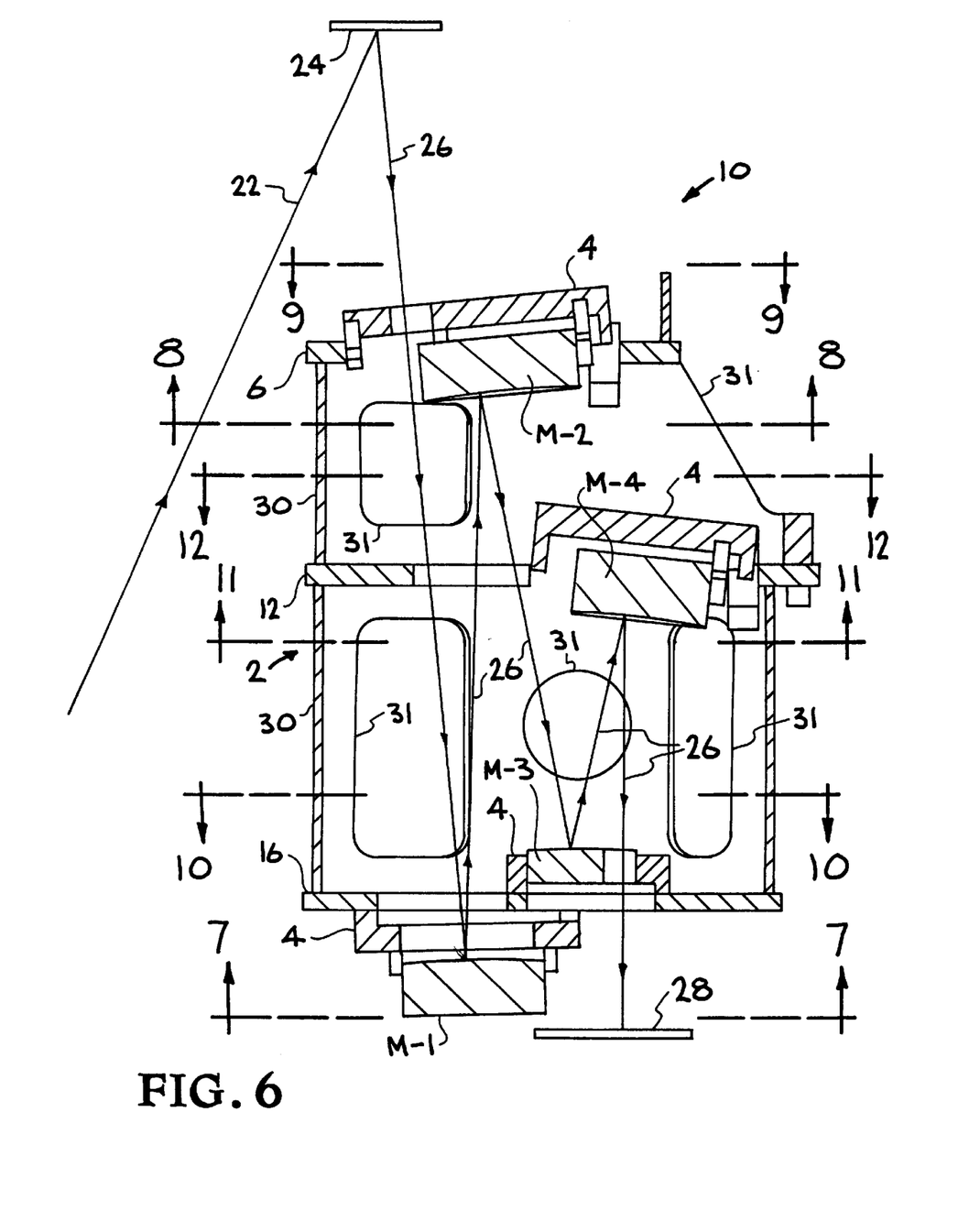
FIG. 6 illustrates a cross section of the PO box of FIG. 1 with the optics path therethrough between a mask and a target.

FIG. 6 is a cross section of the PO box or assembly 10 illustrating the four (4) precision actuators 4 on which are mounted the optics or mirrors M1, M2, M3, and M4 with the optical paths or beam 22 and 26 as illustrated in FIG. 3 and described above. As in FIG. 3, the illuminating beam 22 from a source illuminates mask/reticle 24 and a reflected pattern from 24 now defining a pattern beam 26 travels via mirrors M1 to M4 onto the target 28, with the optical path through the PO box 10 being defined as a multipass (folded) reduction system. The precision actuator 4 may be of the type illustrated and described thereinafter with respect to FIGS. 15 and 16, and may be constructed as described and claimed in above-referenced copending application Ser. No. 09/098,693.

Figure 7:
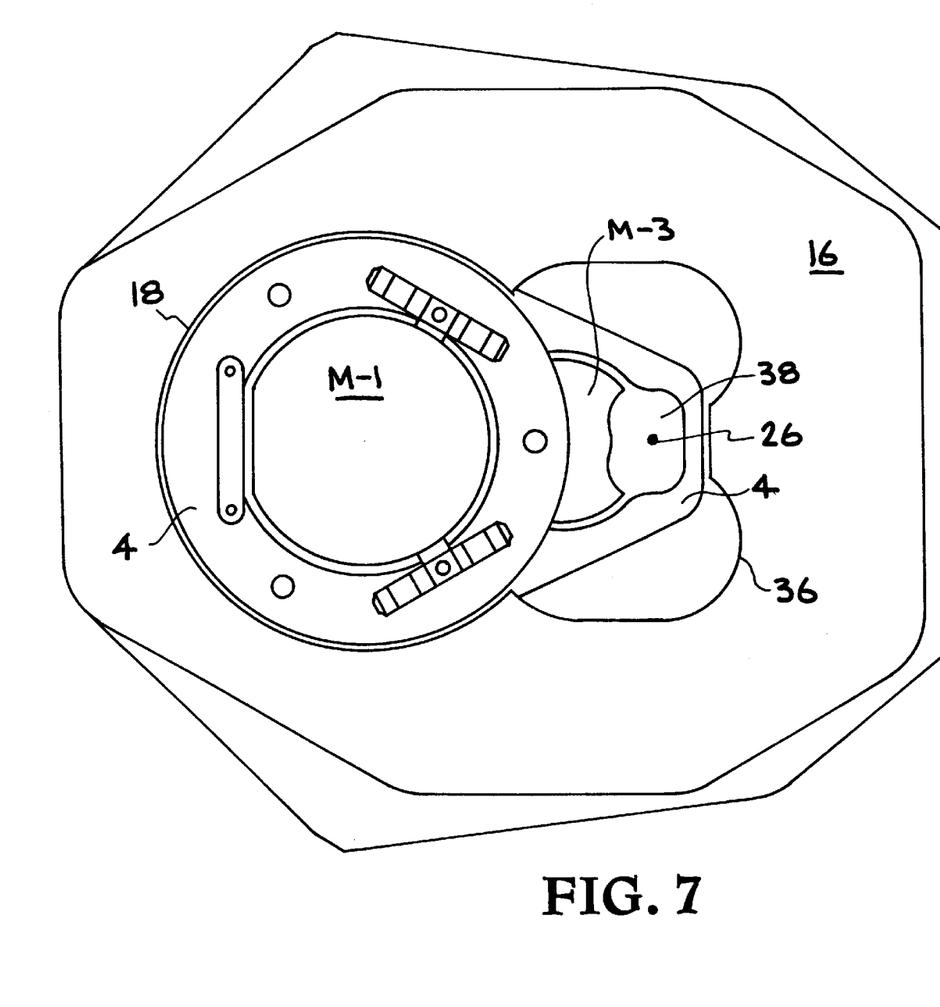
FIG. 7 is a view taken in the direction of arrows 7—7 of FIG. 6.

FIG. 7 is a view taken in the direction of arrows 7—7 of FIG. 6 looking up at the bottom of bulkhead 16 and shows the cutout 18 in bulkhead 16 and the precision actuator 4 as well as the bottom of mirror M1. Also shown is mirror M3 from its bottom side and the precision actuator 4 therefor. Additional cutouts 36 and 38 are provided in bulkhead 16 and precision actuator 4 for mirror M3. Mirror M3 is shown as shaped to pass pattern beam 26 onto mirror M4 and back through cutout 38 to target 28, as seen in FIG. 6.

Figure 8:
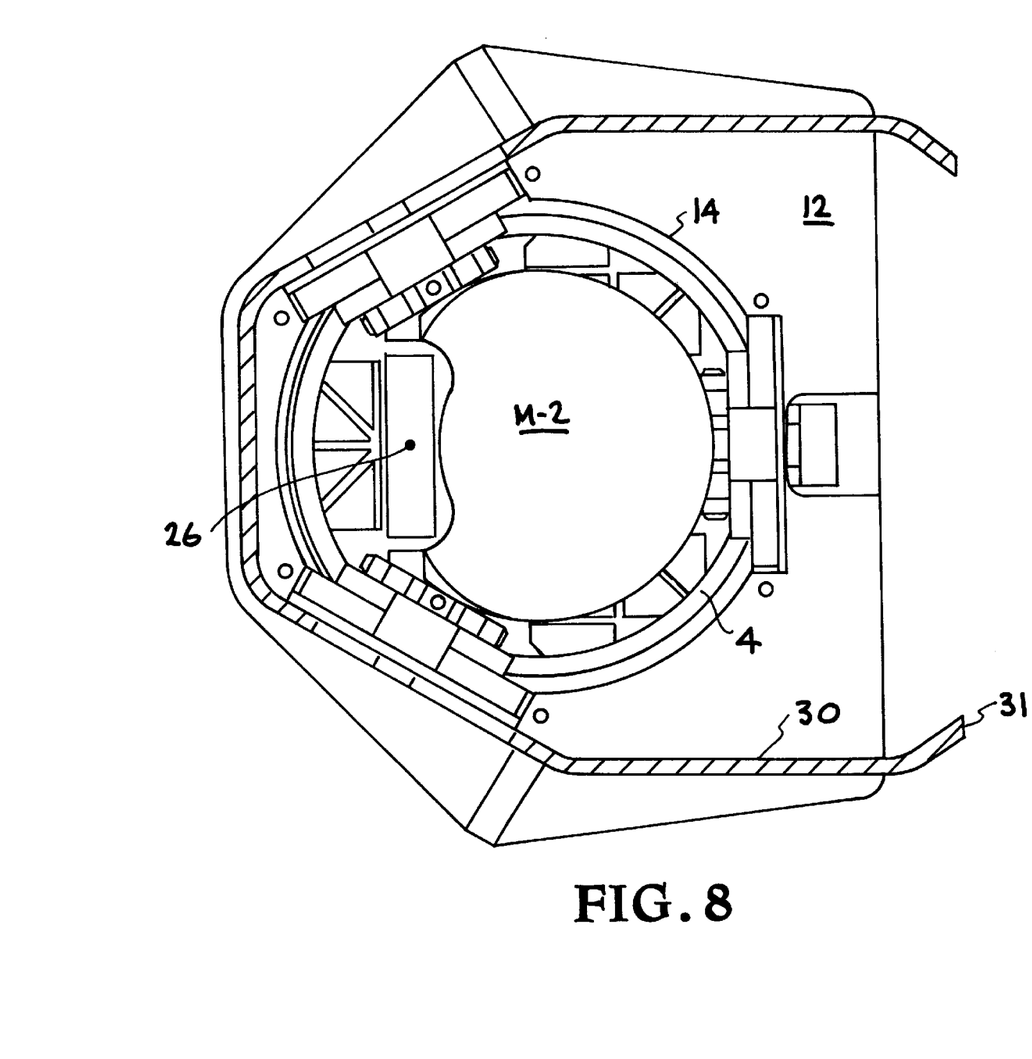
FIG. 8 is a section of the PO box taken in the direction of arrows 8—8 of FIG. 6.

FIG. 8 shows a section of PO box or assembly 10 taken in the direction of arrows 8—8 of FIG. 6, and shows middle bulkhead 12 with cutout 14 and precision actuator 4 with a view of mirror M2 contoured to allow passage of pattern beam 26 through precision actuator 4 onto mirror M1, with the beam 26 being reflection from mirror M1 to mirror M2 onto mirror M3.

Figure 9:
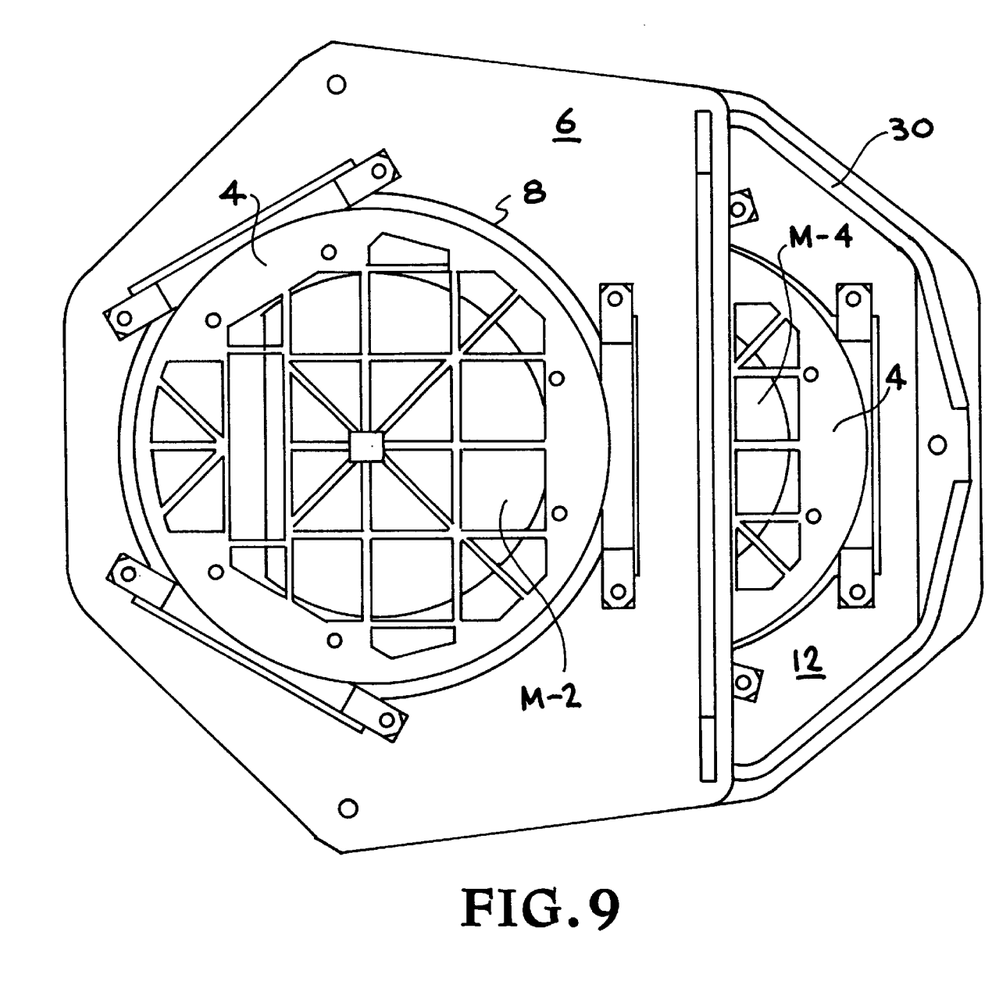
FIG. 9 is a top view of an optics assembly taken in the direction of arrows 9—9 of FIG. 6.

FIG. 9 is a view taken in the direction of arrow 9—9 of FIG. 6 and is a top view of bulkhead 6 with cutout 8, precision actuator 4, and the backside of mirror M2. Also shown is a section of middle bulkhead 12, cutout 14, precision actuator 4, and mirror M4, showing the backside of mirror M4. As seen in FIG. 6, the pattern beam 26 passes through an opening in precision actuator 4 of mirror M2 onto mirror M2 and which is then reflected onto mirror M2.

Figure 10:
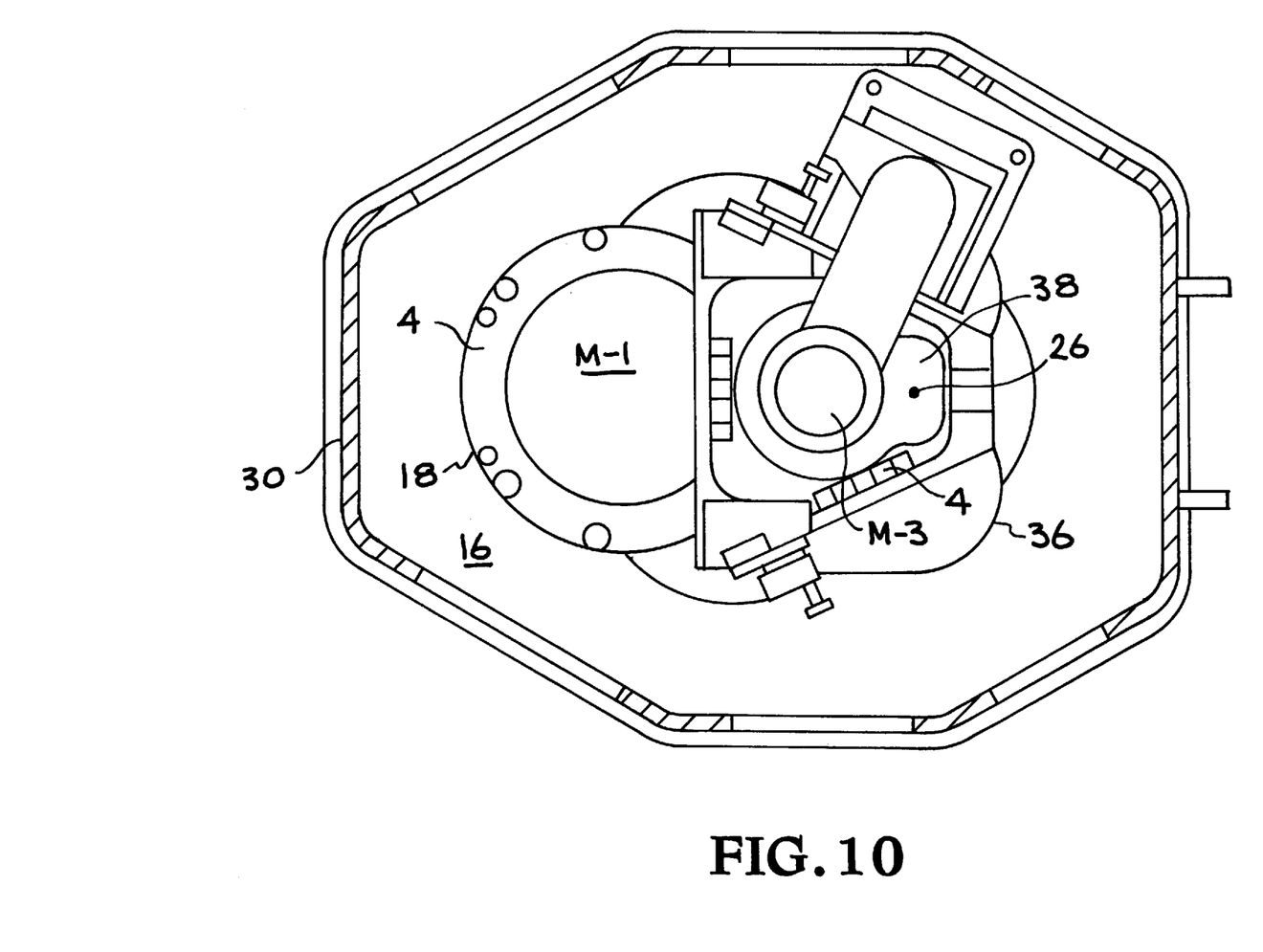
FIG. 10 is a view looking down on an optics assembly in the direction of arrows 10—10 of FIG. 6.

FIG. 10 is a view taken in the direction of arrows 10—10 of FIG. 6 looking down on the reflective or front surface of mirror M3, and showing the bottom bulkhead 16, cutout 18, and precision actuator 4 for mirror M3. The pattern beam 26 passes from mirror M3 to mirror M4 and through cutout 38 in precision actuator 4 and cutout 36 in bottom bulkhead 16 to target 28. Also shown mounted in bulkhead 16 is the precision actuator 4 for mirror M1 and the reflective or front surface of mirror M1.

Figure 11:
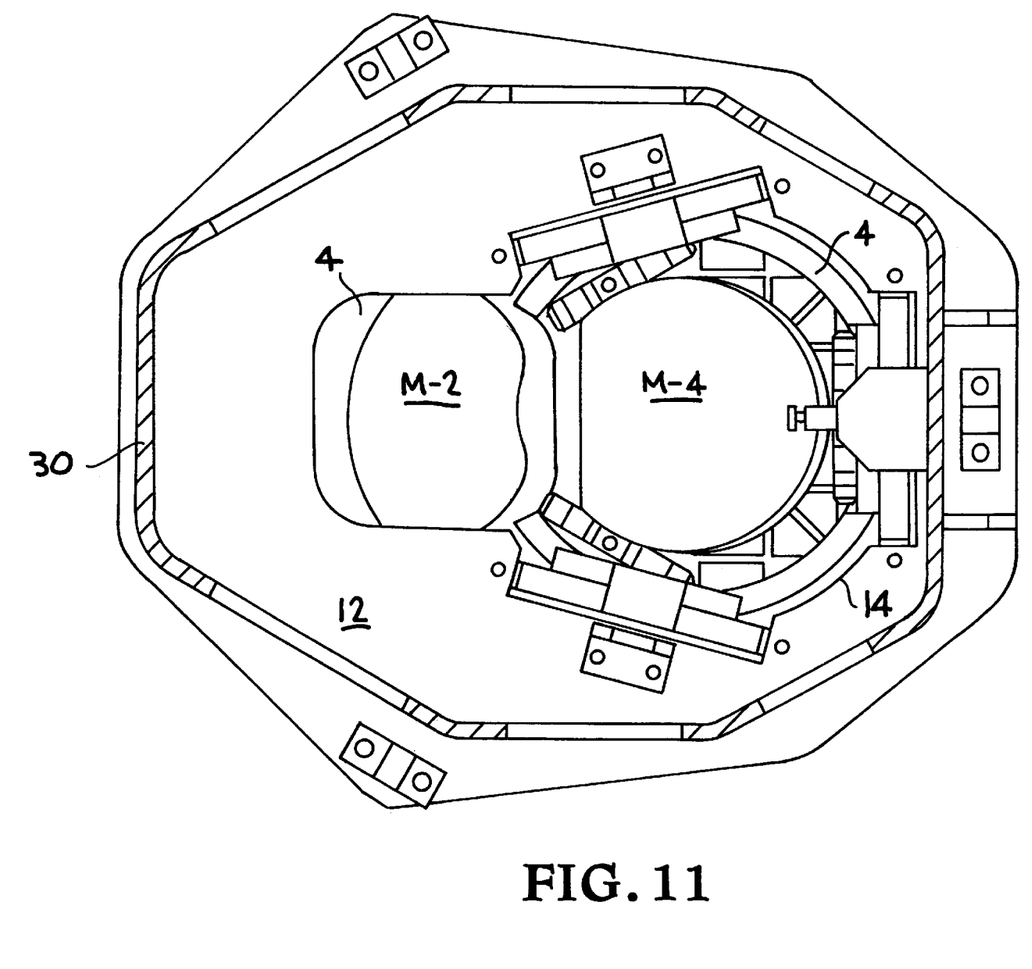
FIG. 11 is a view looking up at an optics assembly in the direction of arrows 11—11 of FIG. 6.

FIG. 11 is a view looking up at mirror M4 in the direction of arrows 11—11 of FIG. 6 and shows the reflective or front surface of mirror M4 mounted in precision actuator 4 located in cutout 14 of middle bulkhead 12. Also shown in the reflective or front surface of mirror M2 mounted in its precision actuator 4.

Figure 12:
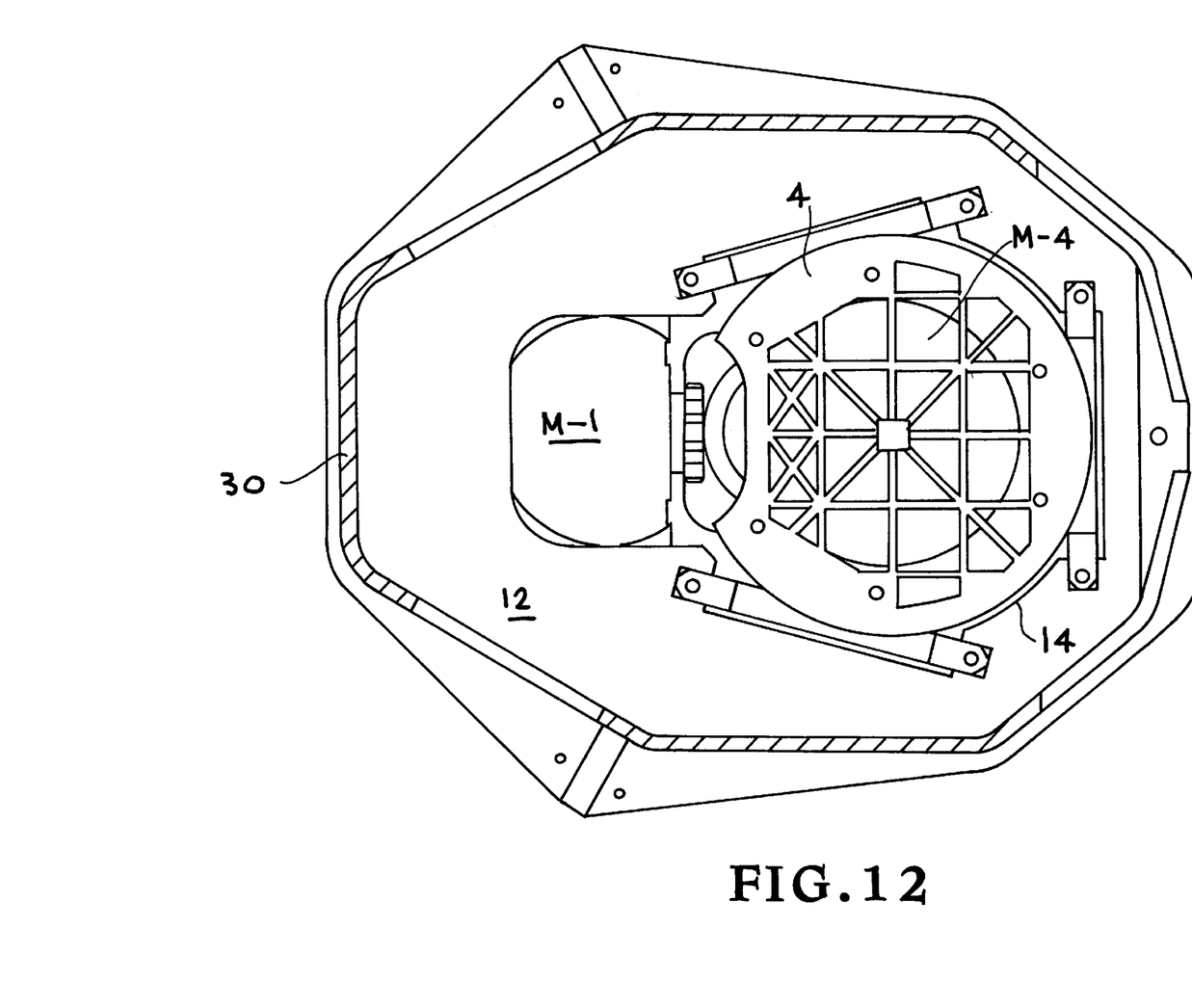
FIG. 12 is a view looking down on the backside of an optics assembly in the direction of arrows 12—12 of FIG. 6.

FIG. 12 is a view looking down on the backside of mirror M4 inm the direction of arrows 12—12 of FIG. 6, and shows middle bulkhead 12, cutout 14, and precision actuator 4 for mirror M4. Also shown is the reflective or front surface of mirror M1 and a portion of precision actuator 4 for mirror M3.

Figure 13:
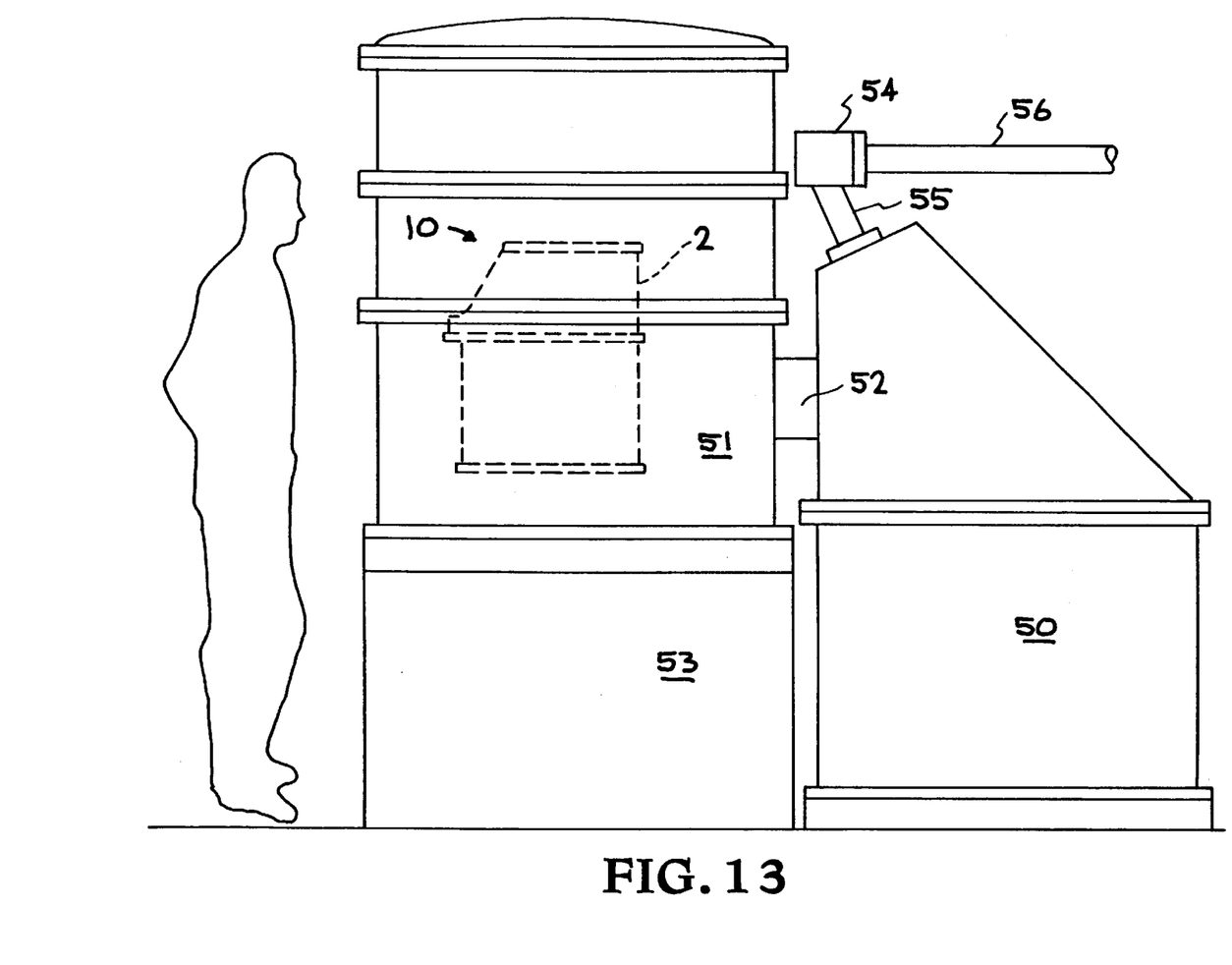
FIG. 13 is a view of an EUVL system with the PO box of the present invention positioned in the projection chamber of the system.
Figure 14:
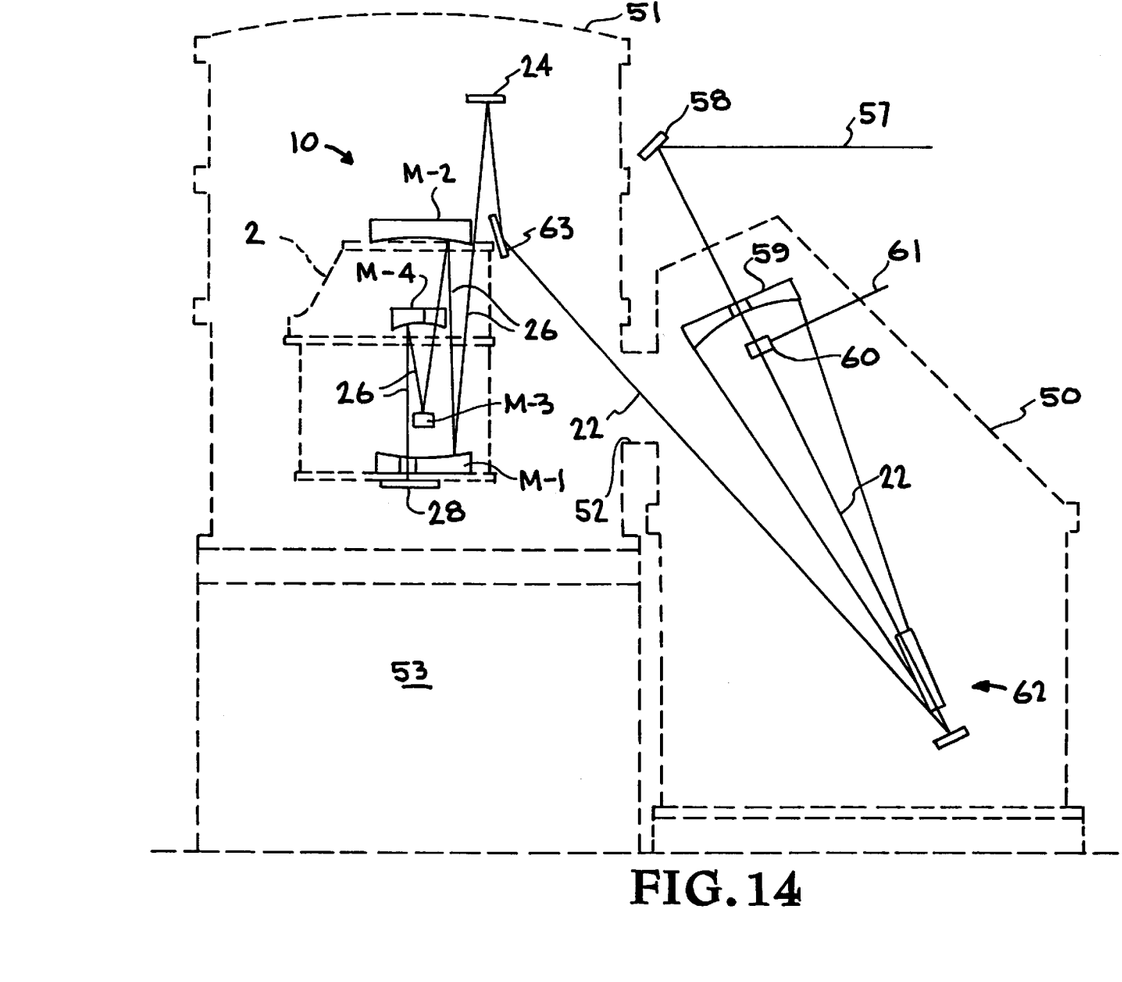
FIG. 14 illustrates the optical path of the EUVL system of FIG. 13.

FIGS. 13 and 14 schematically illustrate an embodiment of an EUVL system and the optical path thereof, with the PO box or assembly of the present invention mounted therein. As shown the system includes a source chamber 50 and a main vacuum or projection chamber 51 provided with appropriate connector tube indicated at 52, with projection chamber 51 being mounted on a support 53, and source chamber 50 being provided with a reflector box 54 via a tube 55, with reflector box 54 being connected to a source, such as a laser, via a tube 56. The housing or structure 2 of PO box or assembly 10 is mounted in projection chamber 51. The reason for the projection chamber 51 in this embodiment being mounted on support 53 is apparent from FIG. 14 to enable the illumination beam 22 to be directed onto the mask/reticle 24. As shown in FIG. 14, a laser beam 57 passes through tube 56 onto a reflector 58 located in reflector box 54 and through tube 55 into source chamber 50 in which is mounted a collector 59, a plasma generator 60 having a gas inlet or supply 61, and a reflector assembly 62. The laser beam 57 after passing through the collector 59 and plasma generator 60 results in the illumination beam 22. The beam 22 from reflector assembly 62 passes through connector tube 52 into the main or projection chamber 51 and is reflected by an optic or mirror 63 onto the mask/reticle 24, which became the pattern beam 26 as described above. While not shown, the EUVL system is provided with an appropriate vacuum system, electrical system, and precision actuator control system, etc., to enable operation of the overall EUVL system.

Figure 15:
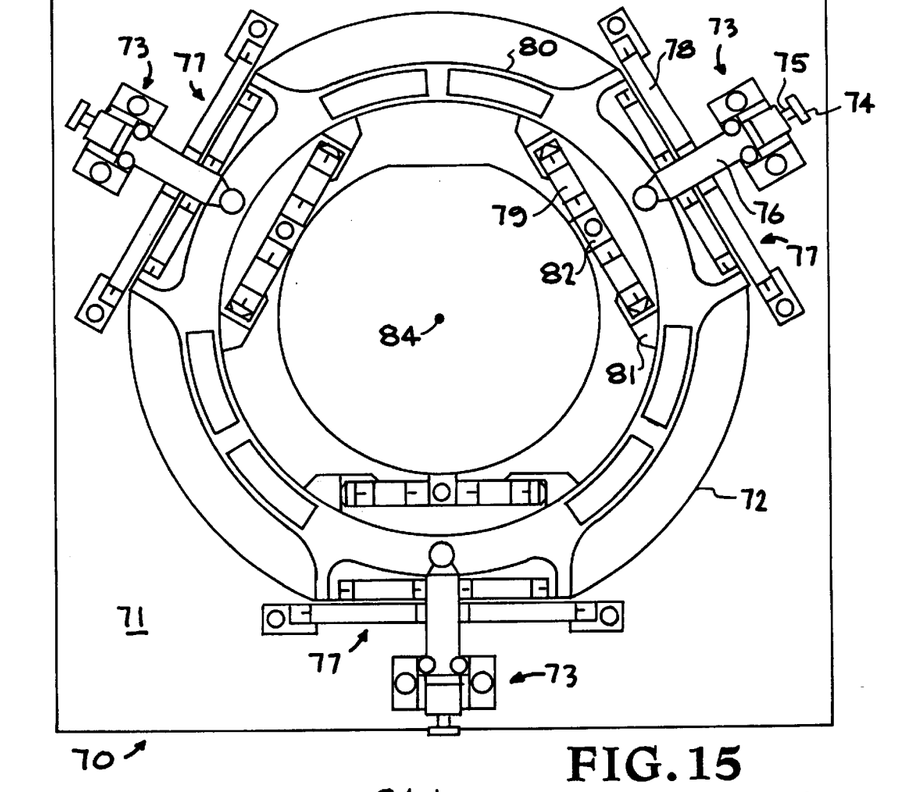
FIGS. 15 and 16 are top and side views of an embodiment of a precision actuator that may be utilized for positioning the optics of the PO box of FIG. 1.
Figure 16:
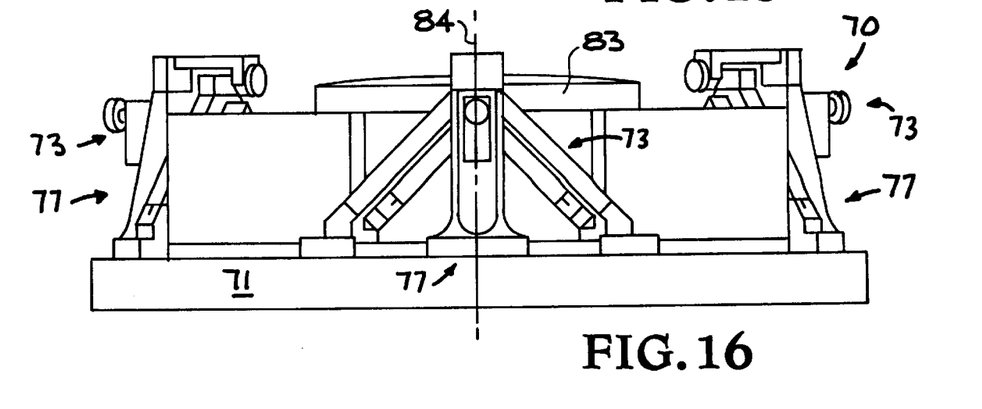

FIGS. 15 and 16 show top and side views of an embodiment of a precision actuator, such as actuators 4 of the FIG. 1 PO box 10. The actuator, generally indicated at 70 provides three degrees of freedom, known in the art as tip, tilt, and piston (the x, y and z axis), and belongs to the class of parallel-link mechanisms, which offer significant advantages at the complication of coordinated axis moves. Besides being stiffer, parallel-link mechanisms provide exact constraint for the suspended optical surface, such as mirrors M1 to M4 of PO box 10. The precision actuator 70 includes a base or support plate 71 having an opening 72, with three commercially available push-pull (linear) actuators 73 equally positioned around opening 72. Each linear actuator 73 is secured to base plate 71 and includes an actuator adjustment knob 74, an adjustment screw 75, and a spring plunger mount 76. The actuator 70 includes three equally spaced flexure mechanisms 77 pressed against a spring plunger 76 of each linear actuator 73. Each of the spaced flexure mechanisms include a first flexure 78, a second flexure 79, a stiffening ring 80, a flexure link plate 81, and a mounting boss 82 which connects the second flexure 79 to an optical mount 83 mounted on ring 30 having a vertical axis (z) indicated at 84. Since the details of the precision actuator 70 of FIGS. 15 and 16 do not constitute part of the present invention, further description is deemed unnecessary. However, such details are set forth in above-referenced copending application Ser. No. 09/098,693.

It has thus been shown that the present invention provides a projection optics box or assembly which includes a plurality of optics or mirrors, each of which may be mounted via a precision actuator to provide movement in the x, y, and z planes. The optic path within the housing is a multipass (folder) reduction system, and this is particularly adapted for use in an EUVL system operating in the 10–14 nm region wavelength.

While a particular embodiment of the invention has been illustrated and described, such is not intended to be limiting. Modifications and changes may become apparent to those skilled in the art, and it is intended that the invention be limited only by the appended claims.

What is claimed is:

1. A projection optics assembly, comprising:
   a housing composed of a plurality of bulkheads, and having at least one opening in each end, of said housing
   a plurality of optical components mounted in spaced relation within said housing,
   at least one of said optical components being mounted in said housing via at least one precision actuator for movement in an x, y, or z plane.

2. The projection optics assembly of claim 1, wherein said plurality of bulkheads of said housing are composed of at least two bulkheads with at least one interconnecting wall member, said at least one wall member having at least one access opening therein.

3. The projection optics assembly of claim 1 where said plurality of bulkheads of said housing are composed of a top bulkhead, a middle bulkhead, and a bottom bulkhead, a first wall member secured intermediate said top and middle bulkheads, and a second wall member secured intermediate said middle and bottom bulkheads, each of said bulkheads having at least one opening therein.

4. The projection optics assembly of claim 3, wherein said first and second wall member include at least one access opening therein.

5. The projection optics assembly of claim 3, wherein four optical components are mounted within said housing, a first of said four optical components being secured to said top bulkhead, a second of said optical components being secured in said middle bulkhead, and a third and fourth of said optical components being secured in said bottom bulkhead.

6. The projection optics assembly of claim 5, wherein said first optical component is mounted in a first precision actuator secured in an opening in said top bulkhead, wherein said second optical component is mounted in a second precision actuator secured in said middle bulkhead, and which each of said third and fourth optical components is mounted a third and fourth precision actuator secured in said bottom bullhead.

7. The projection optics assembly of claim 6, wherein each of said precision actuators is mounted in an opening in its respective top, middle, and bottom bulkheads.

8. The projection optics assembly of claim 7, wherein an optical signal is reflected through an opening in said top bulkhead, an opening in said middle bulkhead onto an optical component mounted in said bottom bulkhead, and is then reflected through an opening in said middle bulkhead onto an optical component mounted in said top bulkhead, and is then reflected through an opening in said middle bulkhead onto an optical component mounted in said bottom bulkhead, and is then reflected onto an optical component mounted in said middle bulkhead, and is then reflected through an opening in said bottom bulkhead.

9. The projection optics assembly of claim 8, wherein said optical signal defines a pattern beam from a mask/reticle located externally of said housing, and wherein said pattern beam is reflected by said four optical components onto a target located externally of said housing.

10. The projection optics assembly of claim 9, wherein said pattern beams is formed from an illumination beam directed onto said mask/reticle.

11. The projection optics assembly of claim 10, wherein said illumination beam is produced by from a plasma generator having a laser beam directed thereinto.

12. The projection optics assembly of claim 1, wherein said plurality of optical components each have a reflectivity of at least 65%, and each constructed to operate in a wavelength of 10–14 nm.

13. A projection optics box having optical components therein mounted to produce a multipass reduction system, comprising:
   a housing having a plurality of bulkheads,
   a plurality of optical elements mounted in said bulkheads of said housing,
   three of said plurality of optical elements being mounted at different height levels in said housing,
   at least said three of said plurality of optical elements being mounted in said housing via precision actuators for movement in an x, y, or z plane.

14. The projection optics box of claim 13, in combination with a mask/reticle and a target located externally of said housing, whereby an optical signal from said mask/reticle is reflected by said plurality of optical elements onto said target.

15. The projection optics box of claim 13, wherein said plurality of optical elements comprises four mirrors having a reflectivity of greater than 65%, and wherein two of said four mirrors are mounted at a bottom level of said housing wherein one of said four mirrors is mounted at a top level of said housing, wherein one of said four mirrors is mounted at a middle level of said housing, and wherein each of said four mirrors is mounted via one of said precision actuators, whereby each of said four mirrors can be independently moved in an x, y, or z plane.

16. The projection optics box of claim 15, wherein each of said top level, middle level, and bottom level is formed by one of said plurality of bulkheads, and wherein a wall member is secured intermediate two adjacent bulkheads, said precision actuators being mounted in openings in said bulkheads.

17. The projection optics box of claim 16, wherein said four mirrors are mounted in said housing such that an incoming optical signal is first directed onto a mirror located in a bottom bulkhead, then onto a mirror located in a bottom bulkhead, then onto a mirror located in a top bulkhead, then onto a mirror located in said bottom bulkhead, then onto a mirror located in a middle bulkhead, and then directed out of said housing.

18. The projection optics box of claim 13, in combination with an EURVL system, said EUVL system including a source chamber and an interconnection projection chamber, said projection optics box being mounted in said projection chamber.

19. The combination of claim 13, wherein said plurality of optical elements are constructed to each reflect at a wavelength of 10–14 nm with a reflectivity of at least 65%.

* * * * *